United States Patent [19]
Kogo et al.

[11] Patent Number: 5,437,921
[45] Date of Patent: Aug. 1, 1995

[54] ELECTRONIC COMPONENTS MOUNTING BASE MATERIAL

[75] Inventors: Yasuo Kogo; Takefumi Ito; Mitsuhiro Okumura; Kiyoshi Yoshizaki; Takeji Fujihara; Hirofumi Yamashita, all of Hyogo, Japan

[73] Assignee: Mitsubishi Denki Kabushiki Kaisha, Tokyo, Japan

[21] Appl. No.: 773,818

[22] Filed: Oct. 9, 1991

[30] Foreign Application Priority Data

Oct. 9, 1990 [JP] Japan .................. 2-272666

[51] Int. Cl.6 .............................. B32B 5/06
[52] U.S. Cl. .................. 428/288; 428/292; 428/293; 428/294; 428/247; 428/249; 428/263
[58] Field of Search ........... 428/570, 288, 292, 293, 428/294, 247, 249, 263

[56] References Cited

U.S. PATENT DOCUMENTS 3,894,677 7/1975 La Iacona .

FOREIGN PATENT DOCUMENTS

0363286A2 4/1990 European Pat. Off. .
2130603 11/1972 France .
2546878A1 12/1984 France .
60-046347 3/1985 Japan .

OTHER PUBLICATIONS

"Metal Matrix Composites for Microwave Packaging Components", *Electronic Packaging & Production,* by C. Thaw et al, pp. 27–29, Aug., 1987.
1st International SAMPE Electronics Conference, Jun. 23–25, 1987, "Metal Matrix Composite Microwave Packaging Components", by C. Thaw et al, pp. 452–462.
3rd International SAMPE Electroncis Conference, Jun. 20–22, 1989, "New Approaches to Microwave Circuit Packaging Using Aluminum Metal-Matrix Composites", by John R. Tyler et al, pp. 1068–1077.

Primary Examiner—Patrick J. Ryan
Assistant Examiner—Richard P. Weisberger
Attorney, Agent, or Firm—Lowe, Price, LeBlanc & Becker

[57] ABSTRACT

A base material for mounting electronic components is provided which has a low density and a coefficient of thermal expansion close to that of aluminum and can be processed with ease. The base material essentially consists of aluminum or an aluminum alloy reinforced with carbon fibers with a volume fraction ranging from 0.15 to 0.55, the carbon fibers in the base material being arranged at random on a surface for mounting an electronic component and being arranged in layer in a direction vertical to the above-described surface.

9 Claims, 6 Drawing Sheets

SUCTION-FILTERING

100μm

100 μm

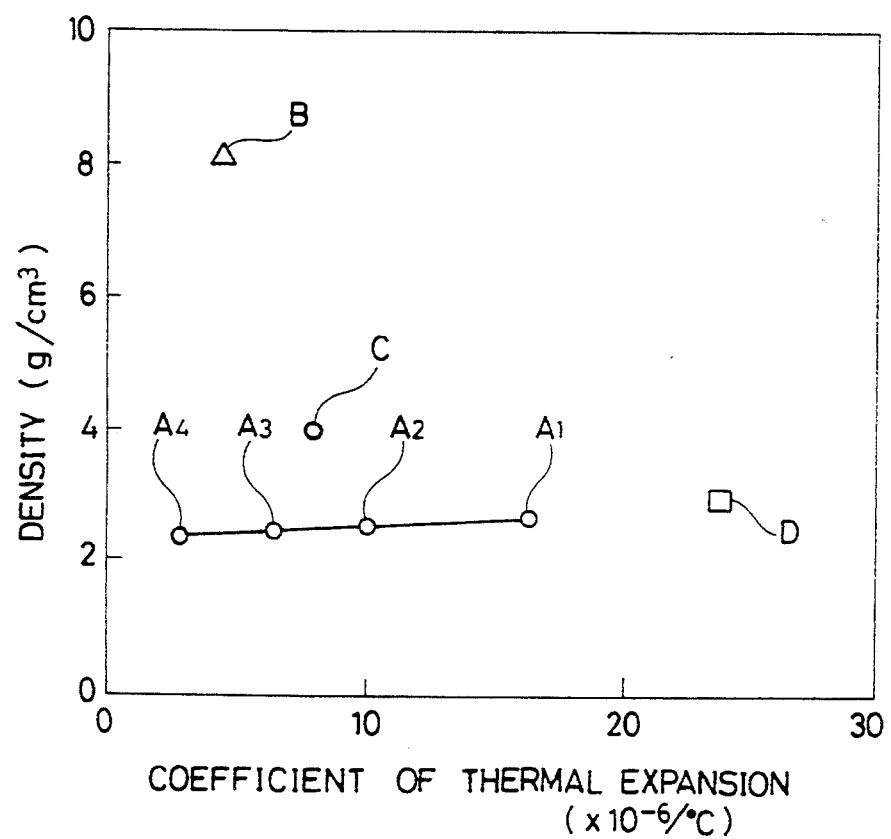

PRELIMINARY
HEATING
500°C × 1hr

METAL MOLD LOCATED

POUR OF MELT

PRESSURE
200 kg/cm²

REMOVAL FROM MOLD

PROCESSING

ELECTRONIC COMPONENTS MOUNTING BASE MATERIAL

BACKGROUND OF THE INVENTION

1. Field of the Invention

The present invention relates generally to base materials for fabricating a carrier, a substrate and a case for use in an assembly of electronic components.

2. Description of the Background Art

A base material for mounting electronic components should have physical properties suitable for maintaining performance and reliability of an electronic assembly. In particular, the base material preferably has a coefficient of thermal expansion (referred to as CTE hereinafter) as close as to CTE ($6-8 \times 10^{-6}/°$ C.) of a semiconductor as an electronic component and a semiconductor packaging material. Furthermore, the base material is desirably light-weight.

Aluminum and an aluminum alloy having a low density (about 2.7 g/cm$^3$) have been conventionally used as suitable materials in view of weight. These metallic materials, however, have a CTE ($23 \times 10^{-6}/°$ C.) higher than those of semiconductor materials. As a result, thermal stress induced between a semiconductor device and a case made from the metallic materials might cause cracks or debonding in the joint portion thereof, resulting in defective electric connection of the semiconductor device, detachment of the components, disconnection of wirings and the like. Electronic assemblies using such metallic materials are not satisfactorily reliable over operating temperature extremes.

Kovar, a high-nickel steel, has typically been used to overcome these shortcomings. Kovar effectively prevents generation of thermal stress because of its CTE (about $6 \times 10^{-6}/°$ C.) lower than that of aluminum. However, high density (8.0 g/cm$^3$) of Kovar leads to an increase in weight of electronic assemblies.

Under the above-described circumstances, metal-matrix composites (referred to as MMC hereinafter) consisting of an aluminum matrix alloy reinforced with silicon carbide particles have been developed for microwave packaging application and the like (Electronic Packaging and Production, August, 1987, p. 27–29; Proceedings of the 1st International SAMPE Electronics Conference Jun. 23–25, 1987, p. 452–462; Proceedings of the 3rd International SAMPE Electronics Conference Jun. 20–22, 1989, p. 1068–1077.). MMC is 60% or more lighter than Kovar and have a CTE lower than that of aluminum or an aluminum alloy. However, silicon carbide contained in MMC makes mechanical processing more difficult, thereby increasing cost therefor. In addition, with a density of about 2.9 g/cm$^3$, the silicon carbide increases weight of the assembly more than by aluminum or an alloy thereof.

Graphite fiber reinforced aluminum (Grf/Al) with fibers arranged in a crossplied manner has been developed for microwave devices (Proceedings of the 1st International SAMPE Electronics Conference Jun. 23–25, 1987, p. 452–462.). Gr$_f$/Al has a low CTE and a low density. However, G$_f$/Al has low strength in a vertical direction to the piling direction of the fibers. In mechanical processing, crossplied fibers peel off in many cases. A processing rate should be reduced to prevent peeling off. When peeling off occurs, the peeled surface should be abraded. An arrangement of graphite fibers in a crossplied manner requires span fibers to be knitted to fabricate cloths which are to be piled. Such process results in low productivity of base materials. In addition, with cloths piled with a particularly low volume fraction, it is not possible to obtain a homogeneous composite material because of difficulty in matching the volume fractions in the entire pile.

SUMMARY OF THE INVENTION

An object of the present invention is to provide a base material having more preferable physical properties to improve performance and reliability of electronic assemblies.

More specifically, an object of the present invention is to provide a )base material which has a low density and a CTE close to that of aluminum or an aluminum alloy and can be fabricated with ease without damages such as detachment.

The present invention provides a base material for mounting electronic components, which includes a matrix essentially consisting of aluminum or an aluminum alloy, and carbon fibers arranged, in the matrix, to be layered in a fixed direction and arranged substantially at random in pseudo-vertical directions to the fixed direction, with a volume fraction from 0.15 to 0.55.

Carbon fibers arranged to be layered in the fixed direction and randomly oriented in the vertical directions thereto can exhibit a CTE lower than that by other arrangements. In addition, the vertical directions forms a plane on which carbon fibers are arranged at random. Random arrangement yields homogeneous physical properties in all the directions on the plane. Such plane is most preferable for mounting electronic components. Furthermore, random arrangement prevents peeling off as caused in the Gr$_f$/Al at the time of processing the base material. In addition, the base material with 15–55 volume percent of carbon fibers can exhibit a CTE closer to a CTE of a material constituting an electronic component such as a silicon chip.

The base material according to the present invention desirably uses relatively short carbon fibers. For example, an average aspect ratio (fiber length/fiber diameter) of carbon fiber is preferably in the range from 10 to 500. More preferably, the aspect ratio is in the range from 30 to 80. Diameter of the fiber is in the range from 5 to 15 $\mu$m, for example. An aspect ratio in this range easily achieves the arrangement of carbon fibers oriented at random in the pseudo-vertical direction with respect to the fixed direction. On the other hand, an average aspect ratio below 10 or above 500 makes the two-dimensionally random arrangement of carbon fibers difficult. In this case, the base material has a relatively high CTE.

The base material according to the present invention is lighter in weight than a conventional base material because carbon fibers have a density lower than that of aluminum. For example, the base material according to the present invention can be fabricated to have a density ranging from 2.4 to 2.6 g/cm$^3$. Such a light-weight base material achieves the assemblies lighter in weight than conventional ones.

Carbon fiber has very low hardness as compared with SiC. In addition, the base material containing carbon fibers has ductility lower than that of the base material formed of aluminum or an aluminum alloy only. This makes carbon fiber reinforced aluminum or aluminum alloy more manufacturable than conventional materials.

The higher an elastic modulus of carbon fiber becomes, the lower volume fraction of carbon fiber a desired CTE achieves. It is preferable to use carbon fiber having an elastic modulus as high as possible. However, increasing elastic modulus means that more cost of fibers is required. It is therefore necessary to select an appropriate elastic modulus in consideration of cost performance. For example, a preferable elastic modulus is in the range from 35000 kgf/cm$^2$ to 90000 kgf/cm$^2$.

A quality of carbon fiber is determined by a raw material and a manufacturing method. For obtaining a high elastic modulus, PAN based carbon fiber and pitch based carbon fiber, for example, are used. Although these fibers have different structures and materials, there is little difference in physical property among base materials using fibers with similar elastic modulus.

Every kind of aluminum and an aluminum alloy can be used as the matrix material. Among the important physical properties of the base material, a CTE and a density largely depend on carbon fiber but not on the material of the matrix.

For increasing a thermal conductivity of the base material, it is preferable to use aluminum as fine as possible. A pure aluminum based material for use in the present invention includes JIS standard No. (U.S. Standard No.) (1050) (1050), 1060 (1060), 1070 (1070), 1080 (1080), 1100 (1100) and 1200 (1200). Such pure aluminum for industrial use offers substantially similar physical properties to the base materials.

For some use of the base material, the base material should endure under severe conditions as vibration. In this case, in order to improve mechanical properties at the cost of a thermal conductivity, it is preferable to use an aluminum alloy having mechanical properties superior to those of pure aluminum. Although any aluminum alloy can be used, it is possible to select an alloy among a group of Al—Cu based, Al—Mn based, Al—Si based, Al—Mg based, Al—Mg—Si based and Al—Zn—Mg based aluminum alloys. A material should be selected having a thermal conductivity as high as possible among those having required mechanical strength. In addition, the aluminum alloy can include the suitable material capable of offering at least one of excellent corrosion resistance, manufacturability and solderability to the base material.

In addition, at least either silicon carbide (SIC) or silicon nitride ($Si_3N_4$) particles or whiskers may be added to the base material according to the present invention. The base material may include at least one material selected among the group comprising whiskers of alumina, graphite, potassium titanate, aluminum borate and zinc oxide.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a graph comparing four types of base material according to the present invention and three types of conventional base material in view of a coefficient of thermal expansion and a density.

DESCRIPTION OF THE PREFERRED EMBODIMENTS

EXAMPLE 1

Figure 3A:
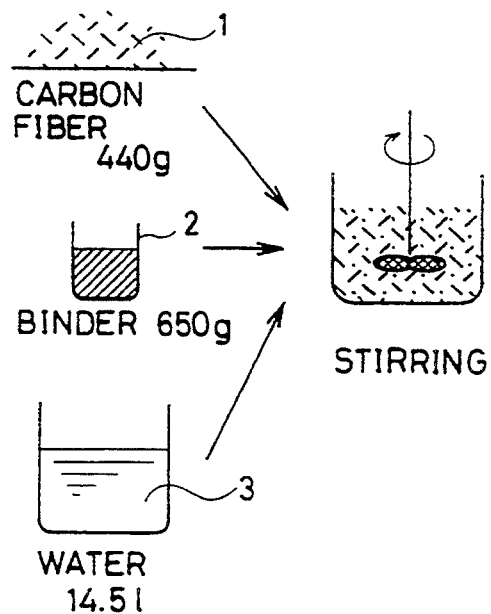
FIGS. 3A-3J are schematic diagrams showing a process of manufacturing the base material according to the present invention in a preferred embodiment.
Figure 3B:
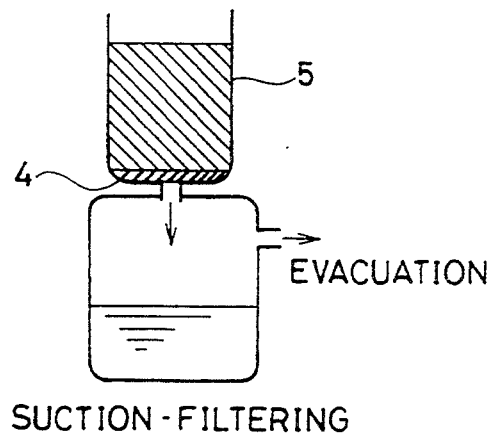
Figure 3C:
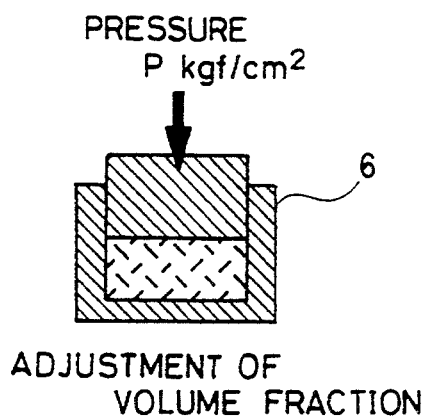
Figure 3D:
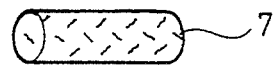

Pitch based carbon fiber was prepared having an average elastic modulus of 55000 kgf/cm$^2$, an average diameter of 10 μm and an average length of 600 μm. An aspect ratio of the carbon fiber was 60. Pitch based carbon fiber is commercially available. With reference to FIG. 3A, 440 g carbon fiber 1 was dispersed in 14.5 l water 3 together with 650 g binder 2 (2% of cellulose fiber in water). In dispersion, stirring was fully carried out to prevent aggregation of the carbon fibers. Then, the dispersing solution was suction-filtered through a funnel 5 with filter paper 4 provided at the bottom thereof (FIG. 3B). In filtering, the dispersing solution in the funnel was stirred vertically in particular. In the suction-filtering, the carbon fibers were arranged at random in a direction parallel to the filter paper and deposited on the paper. That is, the suction-filtering achieves the random arrangement of carbon fibers necessary for obtaining a plane on which electronic components are mounted. Then, the mass made of carbon fibers on the filter paper was put into a metal mold 6 without losing its shape wherein the mass was compression-formed (FIG. 3C). Fiber preform 7 with a desired volume fraction was obtained by changing the pressure Pkgf/cm$^2$ shown in the drawing (FIG. 3D). Table 1 shows pressure P, obtained volume fractions and sizes of an obtained cylindrical fiber preform. A volume fraction of 0.1 was obtained when no compression-forming was performed (indicated as P=0 in Table 1). It was very difficult to obtain a volume fraction larger than 0.55.

TABLE 1

| Pressure P (kgf/cm$^2$) | Volume Fraction | Size (length of 210 mmφ cylinder) (mm) |
| --- | --- | --- |
| 0 | 0.10 | 60 |
| 10 | 0.12 | 50 |
| 20 | 0.15 | 40 |
| 70 | 0.30 | 20 |
| 150 | 0.40 | 15 |
| 500 | 0.55 | 11 |

Figure 3E:
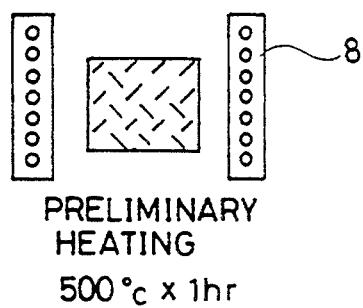
Figure 3F:
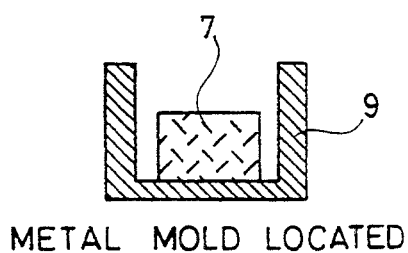
Figure 3G:
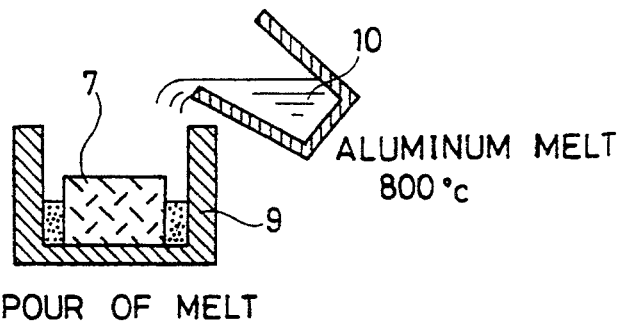
Figure 3H:
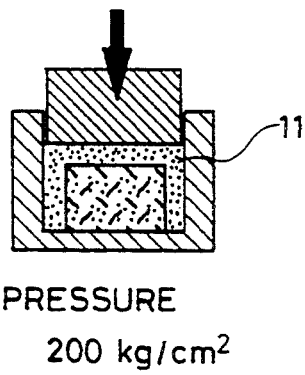
Figure 3I:
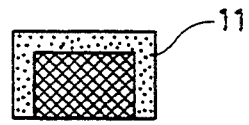
Figure 3J:
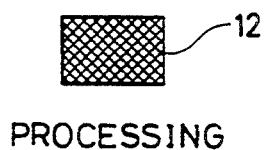

The fiber preform 7 was preliminary heated by a heater 8 at 500° C. for one hour as shown in FIG. 3E. Then, the fiber preform 7 was located in a metal mold 9 to put into aluminum melt 10 of about 800° C. (FIGS. 3F and 3G). Pure aluminum for industrial use (1100) (JIS and U.S. Standard No.) was used. The preform 7 soaked with aluminum melt was put in a mold 11 to which pressure of about 200 kgf/cm$^2$ was applied (FIG. 3H). Aluminum was aggregated in the mold by such high-pressure casting. The molding consisting of carbon fiber reinforced aluminum was taken out of the mold 11 and made into a base material 12 of 20 mm×20 mm×5mm by mechanical processing (FIGS. 3I and 3J). Mechanical processing could be carried out by using a fraise plate or a cutter etc. with extreme ease as for the metallic material.

Figure 1A:
FIG. 1A is a photograph showing metal-carbon fiber constitution obtained as a result of observation, by using an optical microscope, of a surface of the base material for mounting electronic components according to one embodiment of the present invention.
Figure 1B:
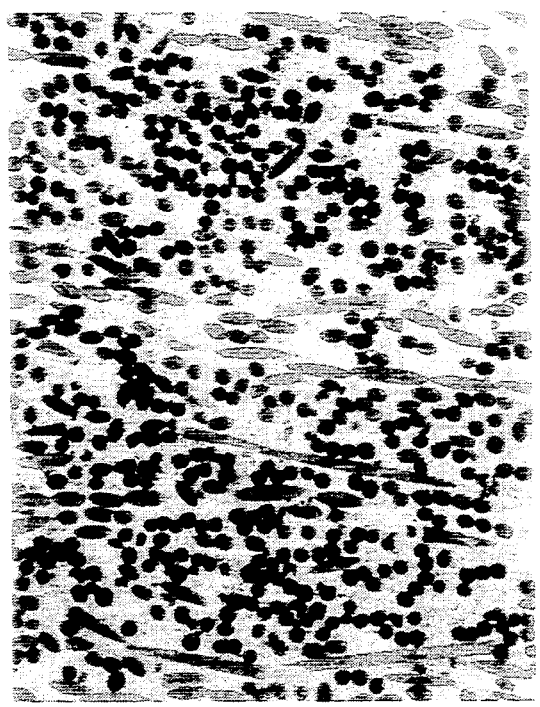
FIG. 1B is a photograph showing the constitution obtained as a result of observation of a plane of the base material vertical to the surface shown in FIG. 1A.

The surface of the obtained base material for mounting electronic components was observed by using an optical microscope. The observation found that carbon fibers were arranged at random in a matrix of the aluminum as shown in FIG. 1A. The surface, as a section of the base material, vertical to said mounting surface was also observed by the optical microscope. The observation found that the carbon fibers were piled in layer in the vertical surface to have its longitudinal direction to be substantially parallel to said mounting surface as shown in FIG. 1B.

A semiconductor device enclosed in a ceramic package of 4 mm × 6 mm × 3 mm was attached to the surface of the base material shown in FIG. 1A by soldering (In—Pb). The base material with the semiconductor device attached thereto was subjected to a thermal endurance test. In the test, the base material was subjected to 200 thermal cycles wherein −70° C. was maintained for 30 minutes which is followed by maintaining 140° C. for 30 minutes. The test was executed five times. After the thermal endurance test, the portion at which the device was attached to the base material was observed by using a loupe. Carbon fibers with volume fractions of 0.1 and 0.12 exhibited cracks at all the joint portions, while carbon fibers with a volume fraction from 0.15 to 0.55 exhibited no crack. This result means that a volume fraction should be 0.15 or above.

FIG. 2 shows a relation between a coefficient of thermal expansion and a density of thus formed base material with a volume fraction from 0.15 to 0.55 and of a conventional base material. In the drawing, $A_1$, $A_2$, $A_3$ and $A_4$ represent base materials including carbon fibers which have a volume fraction of 0.15, 0.3, 0.4 and 0.5, respectively. B represents Kovar, C alumina, and D base material consisting of an aluminum alloy. While the aluminum alloy base material has a density of 2.7 g/cm$^3$, the base material according to the present invention has a density of 2.4–2.6 g/cm$^3$. Therefore, the electronic assembly lighter in weight than the conventional assembly can be obtained by using the base material according to the present invention. Furthermore, like Kovar, the present base material has a coefficient of thermal expansion similar to that of alumina.

A base material including carbon fibers three-dimensionally arranged at random with a volume fraction of 0.15 was manufactured. Carbon fibers were first statically pressed in a dry condition to be made into a fiber preform. A cold isostatic press (CIP) was used for pressing. The pressure was the same or slightly higher than the above. Then, a base material was obtained by high-pressure casting as in the above. The obtained base material had a CTE of $20 \times 10^{-6}$/°C., higher than that of the base material according to the present invention. This result showed that a three-dimensionally random arrangement induces thermal stress larger than by a two-dimensionally random arrangement. With a three-dimensionally random arrangement, increasing volume fraction of carbon fibers to obtain a low CTE made the base material more fragile. As described in the foregoing, the three-dimensionally random arrangement was not preferable in view of strength.

EXAMPLE 2

Like the embodiment 1, fiber molding was formed by using pitch based carbon fibers with an average elastic modulus of 80000 kgf/cm, an average diameter of 10 μm and a length of 1000 μm (aspect ratio 100). The pitch based carbon fibers are commercially available. Table 2 shows pressure P, obtained volume fractions and obtained molding sizes.

TABLE 2

| Pressure P (kgf/cm$^2$) | Volume Fraction | Size (length of 210 mmφ cylinder) (mm) |
|---|---|---|
| 20 | 0.15 | 40 |
| 70 | 0.30 | 20 |
| 150 | 0.40 | 15 |
| 500 | 0.55 | 11 |

Then, high-pressure casting was carried out by using an aluminum alloy (5052) (JIS and U.S. Standard No. ) in the same manner as in the first embodiment. As a result, a base material was obtained which essentially consists of an aluminum alloy reinforced with carbon fibers with a volume fraction of 0.15–0.55. The base material was processed with ease. In the base material, carbon fibers were arranged at random on a horizontal surface on which electronic components were to be mounted. On a vertical surface, carbon fibers were piled to have its longitudinal direction being substantially parallel to the horizontal surface. The same thermal endurance test as in the embodiment 1 exhibited no crack in any base material.

Commercially available carbon fibers having a diameter of 7 μm can replace the carbon fibers with a diameter of 10 μm shown in the above-described embodiment. In addition, a variety of carbon fibers having a diameter of 5–15 μm, for example, can be used.

Other industrial use pure aluminum and industrial use aluminum alloy can be used as matrix materials other than those shown in the above-described embodiment. As a pure aluminum based material, JIS (U.S. Standard) 1060 (1060), 1080 (1080), 1050 (1050) or 1200 (1200) can be used, for example. An aluminum alloy can be selected among Al—Cu based, Al—Mn based, Al—Si based, Al—Mg based, Al—Mg—Si based and Al—Zn—Mg based materials. An aluminum alloy (6061) (JIS and U.S. Standard No.) is one of the suitable materials.

In the above-described embodiment, particles or whiskers of at least either silicon carbide (SIC) or silicon nitride ($Si_3N_4$) can be dispersed together with carbon fibers in water. In this case, the obtained product is reinforced with particles or whiskers of either SiC or $Si_3N_4$. Other materials to be added together with carbon fibers include whiskers of alumina, graphite, potassium titanate, aluminum borate and zinc oxide. The base material can be also reinforced with these materials.

As described in the foregoing, the base material according to the present invention exhibits physical properties superior to those of the conventional base material. In particular, the present base material is advantageous in weight, CTE and manufacturability. This base material increases performance and reliability of an electronic assembly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A base material having a surface for mounting an electronic component, comprising:
   a matrix consisting essentially of at least either aluminum or an aluminum alloy, and
   a non-woven mat of carbon fibers arranged in said matrix with a volume fraction from 0.15 to 0.55, said carbon fibers having an aspect ratio in the range of 10–500, and said carbon fibers being arranged in a plurality of planes wherein each plane is substantially parallel to said surface, such that a longitudinal direction of said carbon fibers is oriented at random in each said plane and said carbon fibers are layered in said planes such that longitudinal axes thereof are substantially parallel to said surface with substantially no carbon fibers oriented substantially perpendicular to said surface.

2. The base material for mounting an electronic component according to claim 1, wherein a diameter of said carbon fibers is from 5 to 15 µm.

3. The base material for mounting an electronic component according to claim 1, wherein an elastic modulus of said carbon fibers is from 35000 kgf/cm$^2$–90000 kgf/cm$^2$.

4. The base material for mounting an electronic component according to claim 1, wherein said carbon fibers are either PAN based carbon fibers or pitch based carbon fibers.

5. The base material for mounting an electronic component according to claim 1, wherein said matrix essentially consists of aluminum.

6. The base material for mounting an electronic component according to claim 1, wherein said matrix comprises materials selected from the group consisting of Al—Cu based, Al—Mn based, Al—Si based, Al—Mg based, Al—Mg—Si based, Al—Zn—Mg based aluminum alloys and combinations thereof.

7. The base material for mounting an electronic component according to claim 1, wherein said base material has a density from 2.4 to 2.6 g/cm$^3$.

8. The base material for mounting an electronic component according to claim 1, wherein said base material includes particles or whiskers of either silicon carbide or silicon nitride.

9. The base material for mounting an electronic component according to claim 1, wherein said base material comprises materials selected from the group consisting of whiskers of alumina, graphite, potassium titanate, aluminum borate, zinc oxide and combinations thereof.

* * * * *